(12) United States Patent
Son et al.

(10) Patent No.: US 9,365,933 B2
(45) Date of Patent: Jun. 14, 2016

(54) METHOD OF FORMING A FINE PATTERN

(71) Applicant: Samsung Display Co., Ltd., Yongin (KR)

(72) Inventors: Jung-Ha Son, Seoul (KR); Su-Bin Bae, Gyeongsan-si (KR); Yu-Gwang Jeong, Anyang-si (KR); Lei Xie, Suwon-si (KR); Yun-Jong Yeo, Seoul (KR); Joo-Hyung Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/718,127

(22) Filed: May 21, 2015

(65) Prior Publication Data

US 2016/0138169 A1  May 19, 2016

(30) Foreign Application Priority Data

Nov. 19, 2014 (KR) .................. 10-2014-0161671

(51) Int. Cl.
 *C23F 1/02* (2006.01)
 *H01L 21/033* (2006.01)
 *G03F 7/00* (2006.01)

(52) U.S. Cl.
 CPC ............... *C23F 1/02* (2013.01); *G03F 7/0002* (2013.01); *H01L 21/0337* (2013.01)

(58) Field of Classification Search
 CPC .............. B81C 1/00031; G03F 7/0002; H01L 21/0337; B44C 1/227; C23F 1/02
 See application file for complete search history.

(56) References Cited

U.S. PATENT DOCUMENTS

| | | | | |
|---|---|---|---|---|
| 8,828,253 | B2 * | 9/2014 | Koole | ................ B81C 1/00031 216/38 |
| 2013/0209755 | A1 * | 8/2013 | Hustad | .................. G03F 7/0002 428/195.1 |
| 2014/0299575 | A1 * | 10/2014 | Brizard | ................. G03F 7/0002 216/49 |
| 2014/0360975 | A1 * | 12/2014 | Hustad | ................ C08F 293/005 216/49 |

FOREIGN PATENT DOCUMENTS

| | | |
|---|---|---|
| KR | 10-2013-0034778 | 4/2013 |
| KR | 10-2014-0007797 | 1/2014 |
| KR | 10-2014-0091316 | 7/2014 |

* cited by examiner

*Primary Examiner* — Duy Deo
(74) *Attorney, Agent, or Firm* — H.C. Park & Associates, PLC (57) ABSTRACT

A method of forming a fine pattern includes providing a first metal layer on a base substrate, providing a first passivation layer on the first metal layer, providing a mask pattern on the first passivation layer, providing a partitioning wall pattern having a reverse taper shape by etching the first passivation layer, coating a composition having a block copolymer between the partitioning wall patterns adjacent each other, providing a self-aligned pattern by heating the composition, and providing a metal pattern by etching the first metal layer using the self-aligned pattern as a mask.

20 Claims, 8 Drawing Sheets

METHOD OF FORMING A FINE PATTERN

This application claims priority from and the benefit of Korean Patent Application No. 10-2014-0161671, filed on Nov. 19, 2014, which is hereby incorporated by reference for all purposes as if fully set forth herein.

BACKGROUND

1. Field

Exemplary embodiments of the present invention relate to a method of forming a fine pattern.

More particularly, exemplary embodiments of the present invention relate to a method of forming a fine pattern improving transmittance.

2. Discussion of the Background

A liquid crystal display ("LCD") apparatus is a type of a flat panel display ("FPD") that is broadly used. Other examples of flat panel displays include, but are not limited to, a plasma display panel ("PDP") and an organic light emitting display ("OLED") panel.

Typically, the LCD apparatus applies voltages to molecules of liquid crystal to adjust arrangements of the molecules, thereby changing optical characteristics of a liquid crystal cell such as birefringence, optical activity, dichroism, and light scattering to display an image.

The liquid crystal display apparatus includes a thin-film transistor TFT array substrate including a pixel electrode, a color filter substrate including a common electrode, and a liquid crystal layer between the substrates. An electric field is generated between the pixel electrode and the common electrode, a transimissivity of each pixel may be controlled by arrangements of the liquid crystal layer which is changed by the electric field thus displaying an image.

The liquid crystal display apparatus generally includes a liquid crystal display panel which displays an image using light transmittance of the liquid crystal, and a backlight unit disposed under the liquid crystal display panel to provide light to the liquid crystal display panel.

As the field has advanced, liquid crystal display panels have become smaller. Thus, finer patterns have been demanded. To this end, photoresists having improved photosensitivity have been in demand. Recently, a process using self-alignment of block copolymer has been used to form a fine pattern.

However, due to inherent characteristics of the block copolymer, when the block copolymer becomes longer, self-alignment is difficult. Therefore, typically, the block copolymer is coated using a partitioning wall. However, the block copolymer may be agglomerated adjacent to the partitioning wall due to coating characteristics of the block copolymer when coating is performed along a specific interface. Thus, it is difficult to form a precise fine pattern, and that transmittance of the display panel may decreased as a result.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a method of forming a fine pattern capable of improving a transmittance.

Additional features of the invention will be set forth in the description which follows, and in part will be apparent from the description, or may be learned by practice of the invention.

An exemplary embodiment of the present invention discloses a method of forming a fine pattern, including providing a first metal layer on a base substrate, providing a first passivation layer on the first metal layer, providing a mask pattern on the first passivation layer, providing a partitioning wall pattern having a reverse taper shape by etching the first passivation layer, coating a composition having a block copolymer between the partitioning wall patterns adjacent each other, providing a self-aligned pattern by heating the composition, and providing a metal pattern by etching the first metal layer using the self-aligned pattern as a mask.

An exemplary embodiment of the present invention also discloses a method of forming a fine pattern that includes providing a first metal layer on a base substrate, providing a first passivation layer on the first metal layer, providing a second metal layer in the first passivation layer, providing a second passivation layer on the second metal layer, providing a mask pattern on the second passivation layer, providing a passivation pattern by etching the second passivation layer, providing a preliminary partitioning wall pattern at a side of the passivation pattern, providing a partitioning wall pattern having a reverse taper shape by etching the second metal layer and the first passivation layer using the preliminary partitioning wall pattern as a mask, coating a composition having a block copolymer between the partitioning wall patterns adjacent each other, providing a self-aligned pattern by heating the composition, etching a portion of the self-aligned pattern, providing a metal pattern by etching the first metal layer using the self-aligned pattern as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
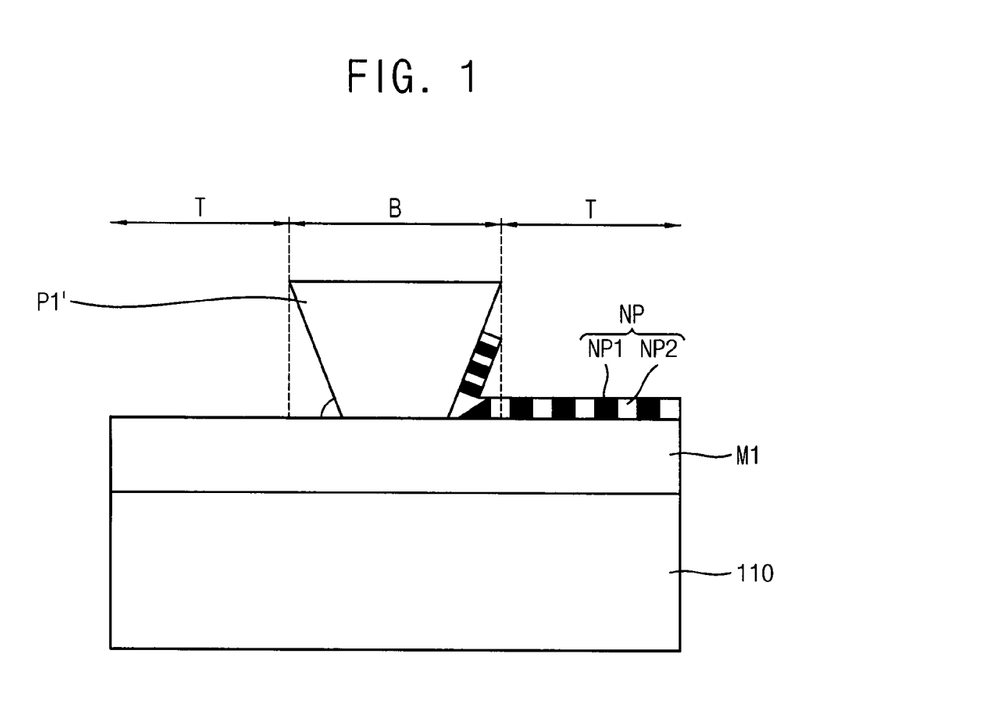
FIG. 1 is a cross-sectional view illustrating a partitioning wall pattern for forming a fine pattern according to an exemplary embodiment of the inventive concept.

FIG. 1 is a cross-sectional view illustrating a partitioning wall pattern for forming a fine pattern according to an exemplary embodiment of the inventive concept. FIGS. 2A to 2M are cross-sectional views illustrating a method of forming a fine pattern according to an exemplary embodiment of the inventive concept.

Referring to FIGS. 1 and 2A to 2M, a first metal layer M1 is formed on a base substrate 110. A first passivation layer P1 is formed on the first metal layer M1. A second metal layer M2 is formed on the first passivation layer P1. A second passivation layer P2 is formed on the second metal layer M2.

Figure 2A:
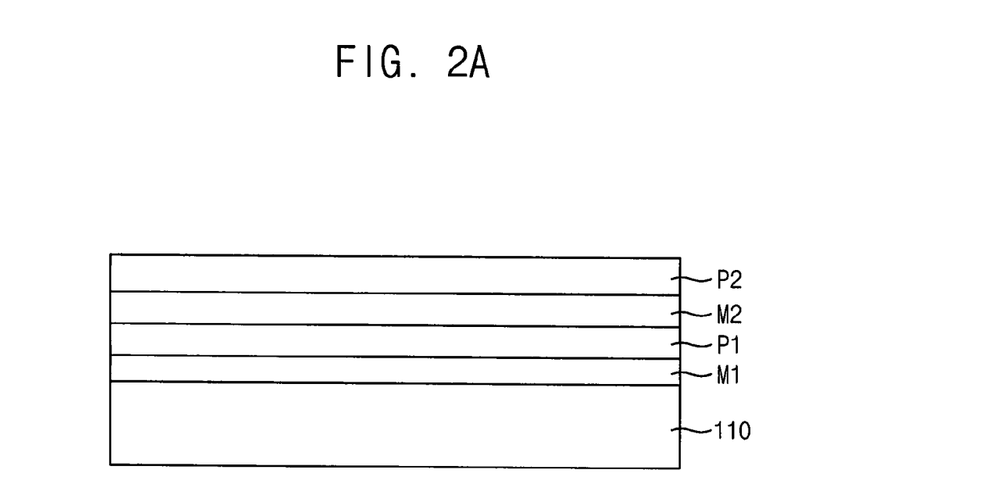
FIGS. 2A, 2B, 2C, 2D, 2E, 2F, 2G, 2H, 2I, 2J, 2K, 2L, and 2M are cross-sectional views illustrating a method of forming a fine pattern according to an exemplary embodiment of the inventive concept.

As shown in FIGS. 1 and 2A, The first metal layer M1, the first passivation layer P1, the second metal layer M2 and the second passivation layer P2 may be formed by sequential lamination.

The first metal layer M1 may include aluminum (Al) or alloy of aluminum. The first metal layer M1 may be formed by sputtering the aluminum or the alloy of aluminum on the base substrate 110, but is not limited thereto.

The first passivation layer P1 may include silicon nitride (SiNx). The first passivation layer P1 may be formed by sputtering the silicon nitride on the first metal layer M1, but is not limited thereto.

The second metal layer M2 may include aluminum (Al) or alloy of aluminum. The second metal layer M2 may be formed by sputtering the aluminum or the alloy of aluminum on the first passivation layer P1, but is not limited thereto.

The second passivation layer P2 may include silicon nitride (SiNx), but is not limited thereto. The second passivation layer P2 may be formed by sputtering the silicon nitride on the second metal layer M2, but the method of deposition is not limited to sputtering.

Figure 2B:
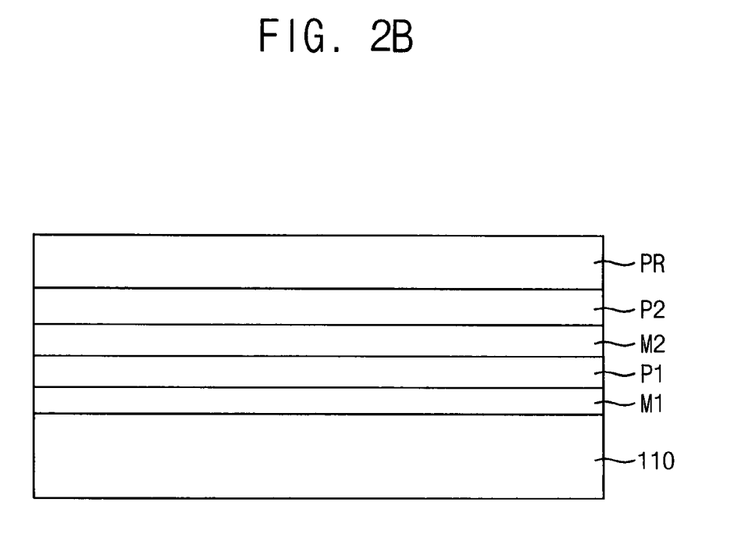

Turning to FIG. 2B, a photoresist layer PR may be formed by coating a photoresist material on the second passivation layer P2. The photoresist material may include a photosensitive organic material such as acryl, but is not limited thereto. For example, the photoresist material may be a negative type photoresist.

Figure 2C:
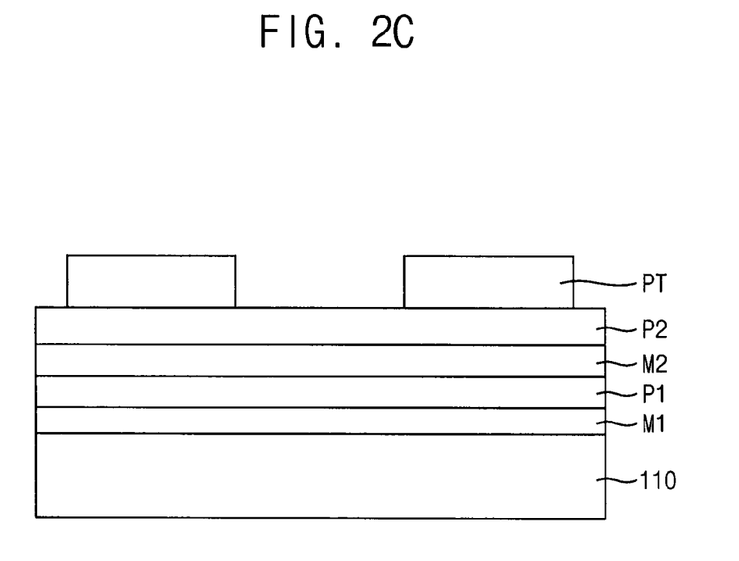

Referring to FIG. 2C, the photoresist layer PR may be exposed to light using a mask. A mask pattern PT may be formed by developing the photoresist layer PR, although other methods of formation may be utilized.

Figure 2D:
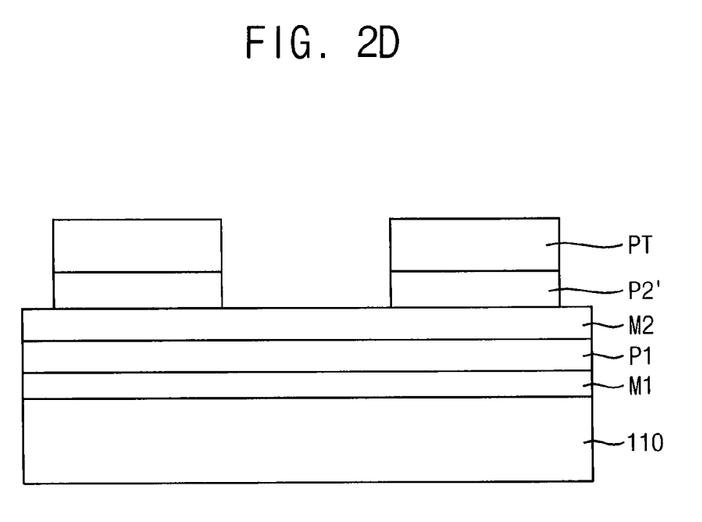

Referring to FIG. 2D, a passivation pattern P2' may be formed by etching the second passivation layer P2 using the mask pattern PT as a mask. The passivation pattern P2' may be formed in an area where a fine pattern will be formed.

Figure 2E:
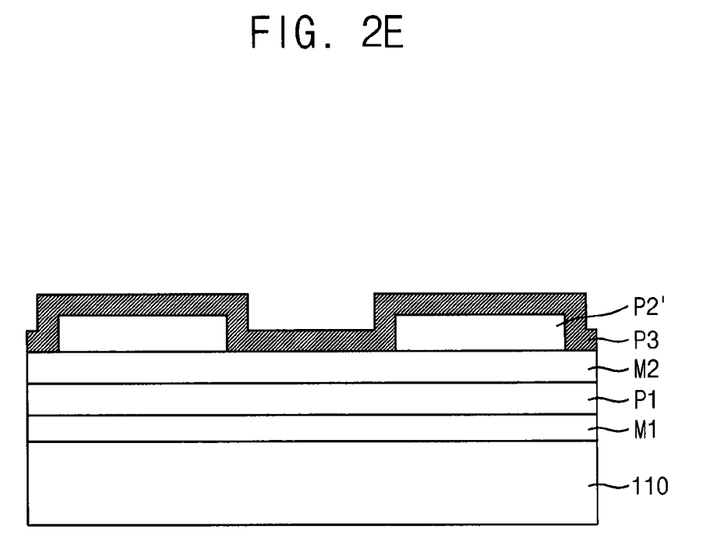

Referring to FIG. 2E, the mask pattern PT may be removed by using a stripper, but removal of the mask pattern is not limited to removal by a stripper. A third passivation layer P3 is formed on the second metal layer M2, on which the passivation pattern P2' is formed. The third passivation layer P3 may be formed on and along an upper surface of the second metal layer M2 and an upper surface the passivation pattern P2'.

The third passivation layer P3 may include silicon oxide (SiOx). The third passivation layer P3 may be formed by sputtering the silicon oxide on the second metal layer M2 and the passivation pattern P2', but is not limited thereto. The third passivation layer P3 may have a thickness of about 0.2 μm to 0.3 μm (micrometer).

Figure 2F:
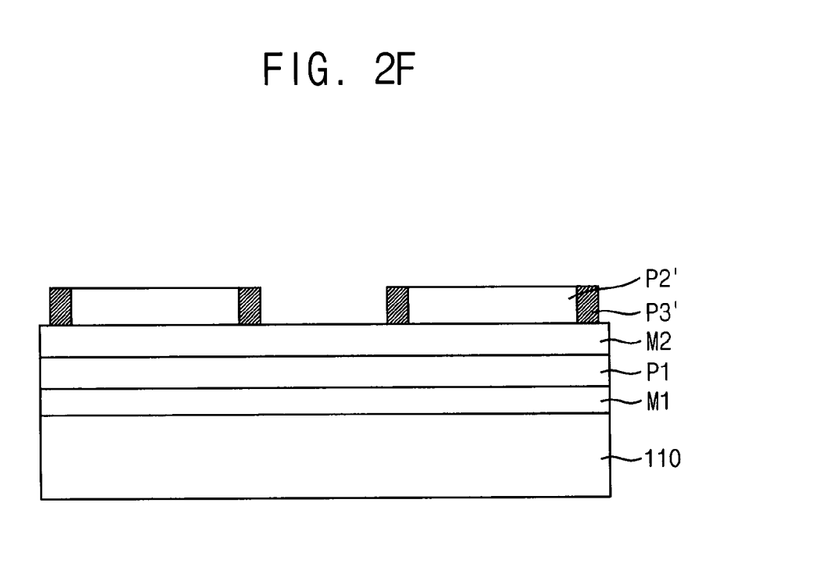

As shown in FIG. 2F, a preliminary partitioning wall pattern P3' may be formed by partially etching the third passivation layer P3. The preliminary partitioning wall pattern P3' may be disposed in an area corresponding to an area where the fine pattern will be formed. The preliminary partitioning wall pattern P3' may be formed at a side of the passivation pattern P2'.

Figure 2G:
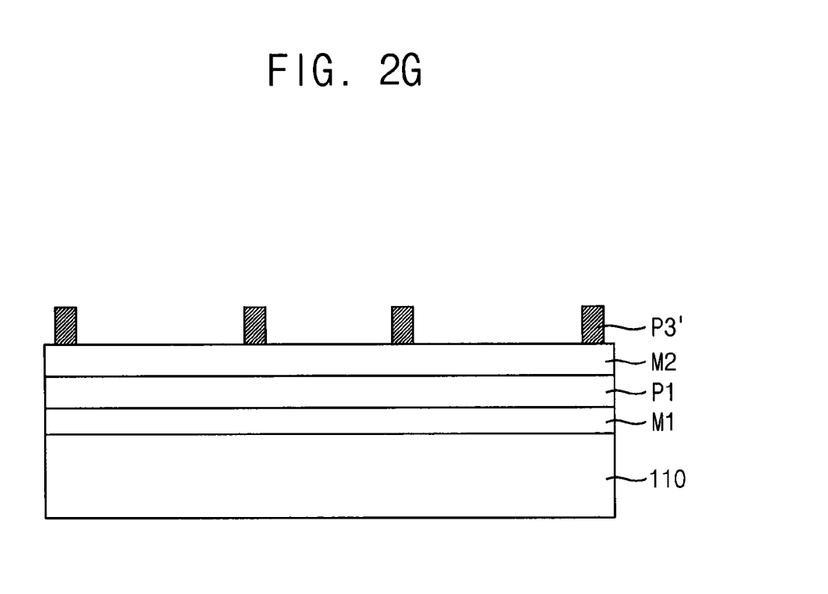

The passivation pattern P2' and the preliminary partitioning wall pattern P3' may include materials different each other. That is, the passivation pattern P2' and the preliminary partitioning wall pattern P3' may have different etching selectivity. Thus, as shown in FIG. 2G, by selectively removing the passivation pattern P2', only the preliminary partitioning wall pattern P3' may remain on the second metal layer M2.

Figure 2H:
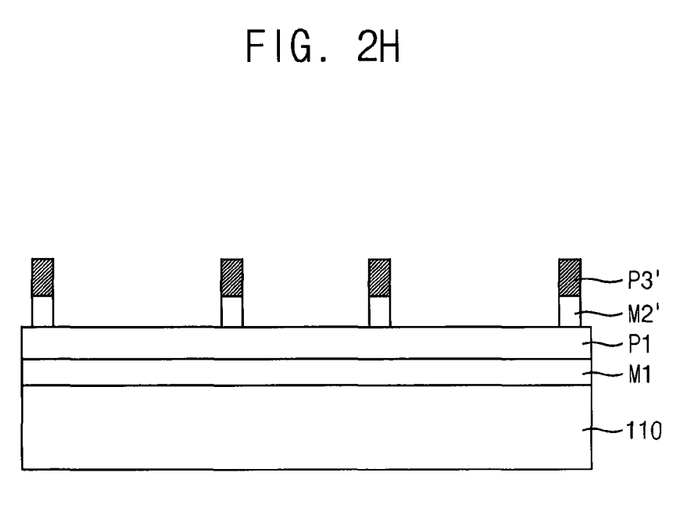

Referring now to FIG. 2H, a sacrificial pattern M2' is formed under the preliminary partitioning wall pattern P3' by etching the second metal layer M2 using the preliminary partitioning wall pattern P3' as a mask.

Figure 2I:
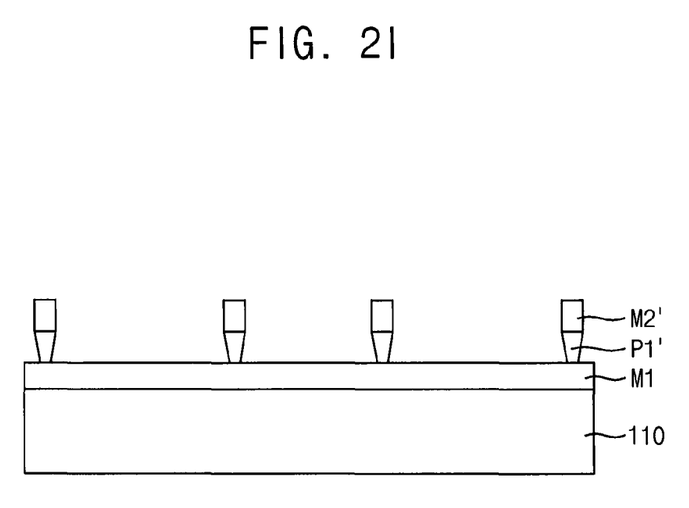

As shown in FIG. 2I, a portion of the first passivation layer P1 and the preliminary partitioning wall pattern P3' may be removed by etching. Thus, a partitioning wall pattern P1' on the first metal layer M1 and the sacrificial pattern M2' on the partitioning wall pattern P1' may be formed.

The sacrificial pattern M2' may be removed, so that only the partitioning wall pattern P1' may be remained on the first metal layer M1. The partitioning wall pattern P1' may have a reverse taper shape. For example, the partitioning wall pattern P1 may have a reverse tapered angle which is greater than about 45° and less than about 90°.

The fine pattern is not formed in an area where the partitioning wall pattern P1' is formed. Thus, the partitioning wall pattern P1' is formed in an area corresponding to a non-display area. A transmittance of a display panel may be decreased when the non-display area is increased.

The fine pattern may be formed using self alignment of the block copolymer. When the block copolymer is coated between adjacent partitioning wall patterns P1', the block copolymer may be sequentially self-aligned along the first metal layer M1. As a coating characteristic of the block copolymer, self-alignment may be performed along a side of the partitioning wall pattern P1', and the block copolymer disposed directly adjacent to the partitioning wall pattern P1', so that light cannot pass in an area where the block copolymer is agglomerated.

When the partitioning wall pattern P1' has the reverse taper shape, the block copolymer is agglomerated under the partitioning wall pattern P1', and may cause decrease of the transmittance of the display panel.

However, in an exemplary embodiment of the present invention, surface treatment may be performed on the base substrate 110 on which the partitioning wall pattern P1' is formed. For example, a surface of the base substrate 110 may be treated by oxygen plasma treatment, ozone oxidation treatment, and/or the like.

A neutralization film (not shown) may be formed by neutralization treatment on the base substrate 110 on which the partitioning wall pattern P1' is formed. According to the neutralization treatment, a surface of the base substrate 110 may have an affinity to a composition having the block copolymer. For example, the neutralization film may be formed by resin composition, but is not limited thereto. A composition including a block copolymer is coated between the adjacent partitioning wall patterns P1'. The composition may include the block copolymer and a solvent. For example, the composition may include the block copolymer of about 0.5 wt % to 20 wt % and the remainder of the weight solvent. Thus, the block copolymer may be a block copolymer of styrene and methymethacrlate (PS-b-PMMA), a block copolymer of styrene and 4-(tetra-butyldimethylsilyl)oxystyrene (PS-b-PSSi), a block copolymer of styrene and dimethylsiloxane (PS-b-PDMS) and/or a block copolymer of styrene and vinylpyrrolidone (PS-b-PVP), but is not limited thereto.

The weight-average molecular weight of the block copolymer may be about 3,000 to 1,000,000. When the weight-average molecular weight of the block copolymer is less than about 3,000, it may be difficult to form a uniform coating film of the composition. When the weight-average molecular weight of the block copolymer is more than about 1,000,000, viscosity of the composition is increased, so that thickness of self-aligned pattern may be increased.

The solvent may be at least one of toluene, xylene, propylene glycol mono-methyl ether aceate (PGMEA), propylene glycol mono-methyl ether (PGME), cyclohexanone, and ethylactate, but is not limited thereto.

Referring back to FIG. 2J, a composition including a block copolymer is coated between the partitioning wall patterns P1', which are adjacent to each other. The block copolymer may be self-aligned to form a self-aligned pattern NP by heating the composition, but other methods of inducing self-alignment are possible.

Figure 2J:
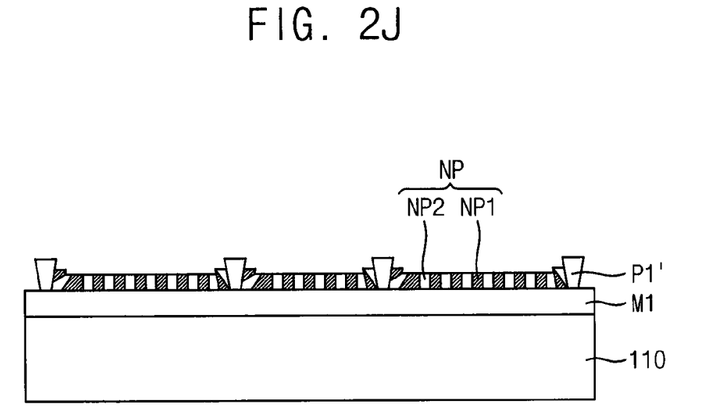

The composition may be heated over glass at transition temperature Tg of the block copolymer. For example, the composition may be heated to between about 200° C. and 300° C. When the heating temperature is less than 200° C. degree, the self-aligned pattern NP may not be formed. When the heating temperature is more than 300° C., the block copolymer may be transformed, so that the self-aligned pattern may not be formed. The composition may be heated for about 1 to 10 minutes, or long enough to achieve the proper results.

The self-aligned pattern NP includes first nano patterns NP1 and second nano patterns NP2. The second nano patterns NP2 may be disposed between the first nano patterns NP1.

The first nano patterns NP1 and the second nano patterns NP2 may have different etching selectivity. Thus, only a part of the first nano patterns NP1 and the second nano patterns NP2 may be etched and other parts may remain. A portion of the self-aligned pattern NP may be etched by oxygen plasma treatment, but is not limited thereto.

In an exemplary embodiment of the present invention, the composition may include a block copolymer of styrene and methymethacrlate (PS-b-PMMA), and the first nano patterns NP1 may include styrene, and the second nano patterns NP2 may include methymethacrlate. Thus, when oxygen plasma treatment is performed on the self-aligned pattern NP, the methymethacrlate may be selectively etched and removed. In this example, the methymethacrlate may have about four times higher etching selectivity than that of the styrene. The selective etching of self-aligned pattern may be performed by a number of methods.

Figure 2K:
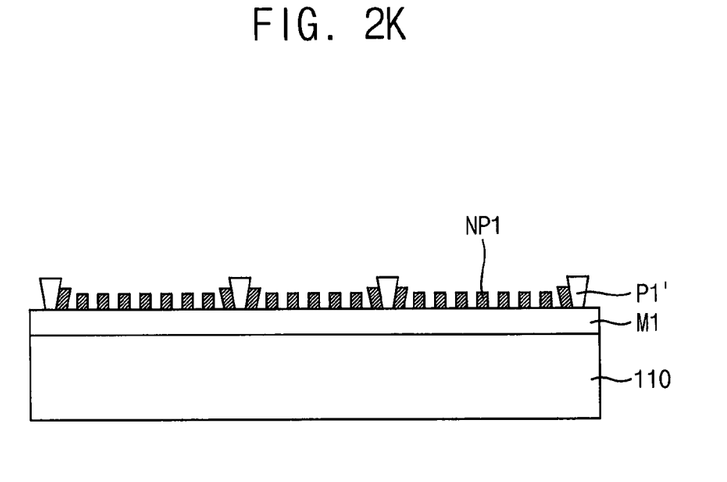

When the portion of the self-aligned pattern NP is etched, the second nano patterns NP2 may be removed, and the first nano patterns NP1 may remain to form a fine pattern, as shown in FIG. 2K. The width of the first nano patterns NP1 may be about 10 nm to 30 nm, but is not limited thereto.

Figure 2L:
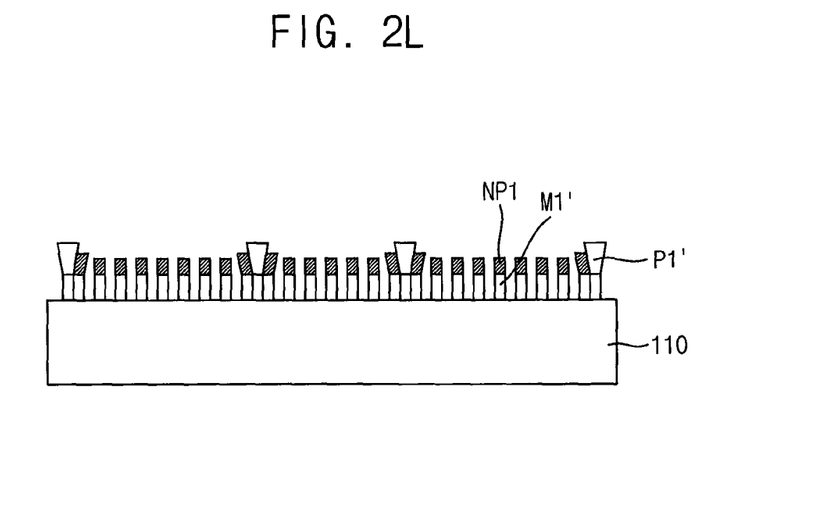

Referring to FIG. 2L, a metal pattern M1' is formed by etching the first metal layer M1 using the first nano patterns NP1 of the self-aligned pattern NP as a mask. Since the metal pattern M1' is formed under the first nano patterns NP1, the first nano patterns NP1 and the metal pattern M1' may have substantially same width.

Figure 2M:
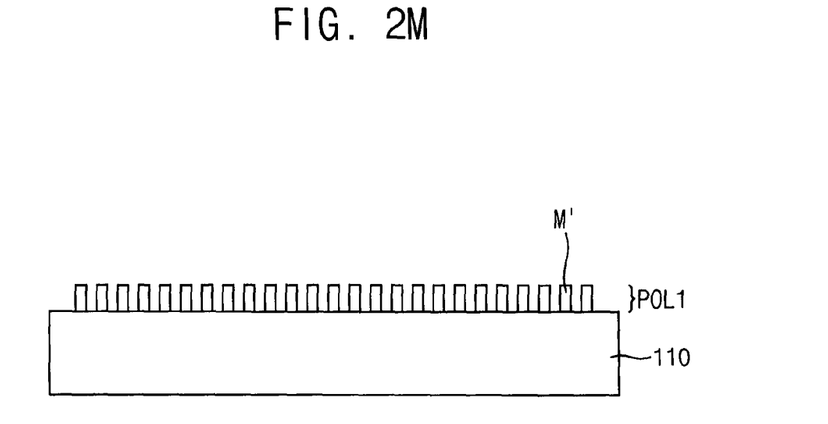

The first nano patterns NP1 and the partitioning wall pattern P1' may then be removed, as shown in FIG. 2M. The first nano patterns NP1 and the partitioning wall pattern P1' may be removed by sonication using a solution such as a toluene applied to the base substrate 110, but is not limited thereto.

Figure 3:
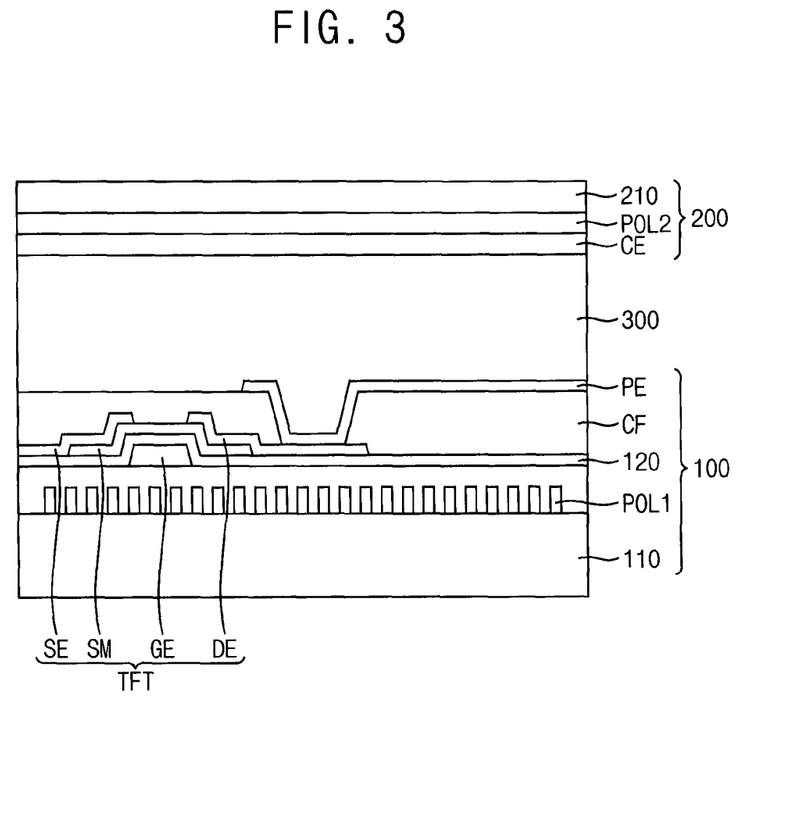
FIG. 3 is a cross-sectional view illustrating a display panel having a fine pattern according to an exemplary embodiment of the inventive concept.

FIG. 3 is a cross-sectional view illustrating a display panel having a fine pattern according to an exemplary embodiment of the inventive concept.

The display of FIG. 3 may include a fine pattern formed by the method of FIGS. 1 and 2A to 2M. A polarizer of the display panel may include the fine pattern.

Referring to FIG. 3, a display panel according to the present exemplary embodiment includes a first substrate 100, a second substrate 200, and a liquid crystal layer 300.

The first substrate 100 includes a first base substrate 110, a first polarizer POL1, a thin film transistor TFT, a gate insulation layer 120, a color filter CF and a pixel electrode PE.

The first base substrate 110 may be a transparent insulating substrate. Examples of the transparent insulating substrate may be, but are not limited to, a glass substrate, a plastic substrate or the like.

The first polarizer POL1 is disposed on the first base substrate 110. The first polarizer POL1 may include a plurality of metal patterns extending along a direction.

A gate pattern including a gate electrode GE and a gate line (not shown) is disposed on the first base substrate 110. The gate line may be electrically connected to the gate electrode GE.

The gate insulation layer 120 is disposed on the first base substrate 110 on which the gate pattern is disposed to cover the gate pattern. The gate insulation layer 120 may insulate the gate pattern.

A semiconductor pattern SM is formed on the gate insulation layer 120. The semiconductor pattern SM is disposed to overlap the gate electrode GE.

A data pattern may include the data line (not shown), a source electrode SE and a drain electrode DE. The data pattern may be disposed on the gate insulating layer 120 on which the semiconductor pattern SM is formed. The source electrode SE may overlap the semiconductor pattern SM. The source electrode SE may be electrically connected to the data line.

The drain electrode DE may be spaced apart from the source electrode SE on the semiconductor pattern SM. The semiconductor pattern SM may have a conductive channel between the source electrode SE and the drain electrode DE.

The thin film transistor TFT may include the gate electrode GE, the source electrode SE, the drain electrode DE, and the semiconductor pattern SM.

The gate insulating layer 120 may include an organic insulating material or an inorganic insulating material. For example, the gate insulating layer 120 may include silicon oxide ($SiO_X$) or silicon nitride ($SiN_X$).

The color filters CF are disposed on the first base substrate 110 on which the thin film transistor TFT is disposed.

The color filter CF may provide color to light which passes the liquid crystal layer 300. For example, the color filters CF may include a red color filter, green color filter and a blue color filter. The color filters CF, which are adjacent to each other, may have different colors from each other, but exemplary embodiments are not limited thereto.

For example, the color CF may be formed spaced apart from a boundary of adjacent pixel area in a first direction and a second direction which crosses the first direction. Thus, the color filters CF may be disposed in an island shape along the first and second directions using the gate and data lines as a boundary (not shown). In another exemplary embodiment, the color filters CF adjacent to each other may partially overlap each other on a border between pixel areas adjacent to each other.

The pixel electrode PE is disposed on the color filter CF. The pixel electrode PE may be electrically connected to the drain electrode DE of the thin film transistor TFT through a contact hole. A grayscale voltage may be applied to the pixel electrode PE through the drain electrode DE of the thin film transistor TFT.

The pixel electrode PE may be disposed in a pixel area. For example, the pixel electrode PE may be disposed between adjacent data lines.

The pixel electrode PE may include a transparent conductive material, such as indium tin oxide ("ITO"), indium zinc oxide ("IZO") and aluminum zinc oxide ("AZO"), but is not limited thereto. According to an exemplary embodiment of the present invention, the pixel electrode PE may have a slit pattern, but is also not limited thereto.

The second substrate 200 includes a second base substrate 210, a second polarizer POL2 and a common electrode CE.

The second base substrate 210 may be a transparent insulating substrate. Examples of the transparent insulating substrate may be, but are not limited to, a glass substrate, a plastic substrate and the like.

The second polarizer POL2 is disposed on the second base substrate 210. The second polarizer POL2 includes a plurality of metal patterns extending along a direction which crosses an extending direction of metal pattern of the first polarizer POL1.

The common electrode CE is disposed on the second polarizer POL2 and a common voltage is applied to the common electrode CE.

The common electrode CE may include a transparent conductive material, such as indium tin oxide ("ITO"), indium zinc oxide ("IZO") and aluminum zinc oxide ("AZO"), but is not limited thereto.

The liquid crystal layer 300 is disposed between the first substrate 100 and the second substrate 200.

The liquid crystal layer 300 may include liquid crystal molecules. Alignment of the liquid crystal molecules in the liquid crystal layer 300 may be controlled by an electric field applied between the common electrode CE and the pixel electrode PE. Thus, a light transmittance of the pixel may be controlled.

Although not shown in the figures, the liquid crystal display panel may include an alignment layer to align the liquid crystal molecules of the liquid crystal layer 300. The alignment layer may pre-tilt liquid crystal molecules in the liquid crystal layer 300.

The display panel according to exemplary embodiments may be used for a liquid crystal display apparatus, organic light emitting display apparatus and the like.

According to the exemplary embodiments of the present inventive concept, the transmittance of the display panel may be improved by forming the partitioning wall pattern having reverse taper shape to self-align the block copolymer.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A method of forming a fine pattern, the method comprising:
    forming a first metal layer on a substrate;
    forming a first passivation layer on the first metal layer;
    forming a mask pattern on the first passivation layer;
    etching the first passivation layer to form a partitioning wall pattern having a reverse taper shape;
    coating the first metal layer in an area between the partitioning wall patterns adjacent each other with a composition comprising a block copolymer;
    heating the composition, the heating transforming the composition into a self-aligned pattern; and
    etching the first metal layer using the self-aligned pattern as a mask to form a metal pattern.

2. The method of claim 1, wherein the first metal layer comprises aluminum or an alloy of aluminum.

3. The method of claim 1, wherein the partitioning wall pattern forms a reverse tapered angle with the first metal layer greater than or equal to 45° and less than or equal to 90°.

4. The method of claim 1, wherein the block copolymer is at least one selected from the group consisting of a block copolymer of styrene and methymethacrlate (PS-b-PMMA), a block copolymer of styrene and 4-(tetra-butyldimethylsilyl) oxystyrene (PS-b-PSSi), a block copolymer of styrene and dimethylsiloxane (PS-b-PDMS) and a block copolymer of styrene and vinylpyrrolidone (PS-b-PVP).

5. The method of claim 1, wherein weight-average molecular weight of the block copolymer is 3,000 to 1,000,000.

6. The method of claim 1, wherein the composition comprising the block copolymer further comprises a solvent.

7. The method of claim 6, wherein the composition comprises about 0.5 wt % to 20 wt % block copolymer.

8. The method of claim 6, wherein the solvent is at least one selected from the group consisting of toluene, xylene, propylene glycol mono-methyl ether aceate (PGMEA), propylene glycol mono-methyl ether (PGME), cyclohexanone, and ethylactate.

9. The method of claim 1, wherein the composition is heated over glass to a transition temperature.

10. The method of claim 9, wherein the composition is heated to between 200° C. and 300° C.

11. The method of claim 1, wherein the self-aligned pattern comprises:
    first nano patterns; and
    second nano patterns disposed between the first nano patterns.

12. The method of claim 1, wherein the first nano patterns and the second nano patterns each have a different etching selectivity.

13. The method of claim 1, further comprising etching a portion of the self-aligned pattern by oxygen plasma treatment.

14. A method of forming a fine pattern, the method comprising:
    forming a first metal layer on a substrate;
    forming a first passivation layer on the first metal layer;
    forming a second metal layer on the first passivation layer;
    forming a second passivation layer on the second metal layer;
    forming a mask pattern on the second passivation layer;
    etching the second passivation layer to form a passivation pattern;
    providing a preliminary partitioning wall pattern at a side of the passivation pattern;
    etching the second metal layer and the first passivation layer using the preliminary partitioning wall pattern as a mask to form a partitioning wall pattern having a reverse taper shape;
    coating the first metal layer in an area between the partitioning wall patterns adjacent each other with a composition comprising a block copolymer;
    providing a self-aligned pattern by heating the composition;
    etching a portion of the self-aligned pattern;
    providing a metal pattern by etching the first metal layer using the self-aligned pattern as a mask.

15. The method of claim 14, wherein the first metal layer comprises aluminum or an alloy of aluminum.

16. The method of claim 14, wherein the partitioning wall pattern forms a reverse tapered angle with the first metal layer greater than or equal to 45° and less than or equal to 90°.

17. The method of claim 14, wherein the block copolymer is at least one selected from the group consisting of a block copolymer of styrene and methymethacrlate (PS-b-PMMA), a block copolymer of styrene and 4-(tetra-butyldimethylsilyl) oxystyrene (PS-b-PSSi), a block copolymer of styrene and dimethylsiloxane (PS-b-PDMS) and a block copolymer of styrene and vinylpyrrolidone (PS-b-PVP).

18. The method of claim 14, wherein the composition is heated to between 200° C. and 300° C.

19. The method of claim 14, wherein the self-aligned pattern comprises:
    first nano patterns; and
    second nano patterns disposed between the first nano patterns.

20. The method of claim 19, wherein the first nano patterns and the second nano patterns each have a different etching selectivity.